United States Patent
Matsuno

(10) Patent No.: US 8,928,374 B2
(45) Date of Patent: Jan. 6, 2015

(54) SEMICONDUCTOR DEVICE AND WIRELESS COMMUNICATION DEVICE

(71) Applicant: Renesas Electronics Corporation, Kawasaki-shi, Kanagawa (JP)

(72) Inventor: Noriaki Matsuno, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/154,680

(22) Filed: Jan. 14, 2014

(65) Prior Publication Data
US 2014/0253191 A1    Sep. 11, 2014

(30) Foreign Application Priority Data
Mar. 5, 2013    (JP) ................... 2013-043284

(51) Int. Cl.
*H03L 7/00*    (2006.01)
*H03L 5/02*    (2006.01)

(52) U.S. Cl.
CPC ...................... *H03L 5/02* (2013.01)
USPC ............ 327/143; 365/226; 365/227; 327/144

(58) Field of Classification Search
USPC .......................................... 327/143; 365/226
See application file for complete search history.

(56) References Cited

U.S. PATENT DOCUMENTS

| | | | | |
|---|---|---|---|---|
| 5,144,159 A * | 9/1992 | Frisch et al. | ................... | 327/198 |
| 5,426,616 A * | 6/1995 | Kajigaya et al. | ............... | 365/226 |
| 5,475,367 A * | 12/1995 | Prevost | ...................... | 340/568.8 |
| 5,814,995 A * | 9/1998 | Tasdighi | ........................ | 324/431 |
| 6,346,835 B1 * | 2/2002 | Ozeki et al. | ..................... | 327/143 |
| 6,686,783 B1 * | 2/2004 | Huang | ............................ | 327/143 |
| 6,972,703 B1 * | 12/2005 | Yen et al. | ........................ | 341/136 |
| 7,030,668 B1 * | 4/2006 | Edwards | ......................... | 327/143 |
| 7,042,787 B2 * | 5/2006 | Fujiu et al. | ..................... | 365/226 |
| 7,180,815 B2 * | 2/2007 | Fujiu et al. | ..................... | 365/226 |
| 7,821,331 B2 * | 10/2010 | Krishna | ........................ | 327/541 |
| 2004/0036514 A1 * | 2/2004 | Kwon | ............................ | 327/143 |
| 2005/0212572 A1 * | 9/2005 | Adams et al. | .................. | 327/143 |

FOREIGN PATENT DOCUMENTS

JP    03-048519 A    3/1991
JP    2005-109659 A    4/2005

* cited by examiner

*Primary Examiner* — Ryan Jager
(74) *Attorney, Agent, or Firm* — Sughrue Mion, PLLC

(57) ABSTRACT

To realize an optimal power-on reset in a system in which the rise of the power supply voltage is sharp.

A semiconductor device according to the present invention includes two diodes connected in parallel between power supplies, and a resistor circuit and a capacitance element connected in parallel between one power supply and each of the two diodes, and outputs a comparison result between voltages outputted from the two resistor circuits as a reset signal.

9 Claims, 14 Drawing Sheets

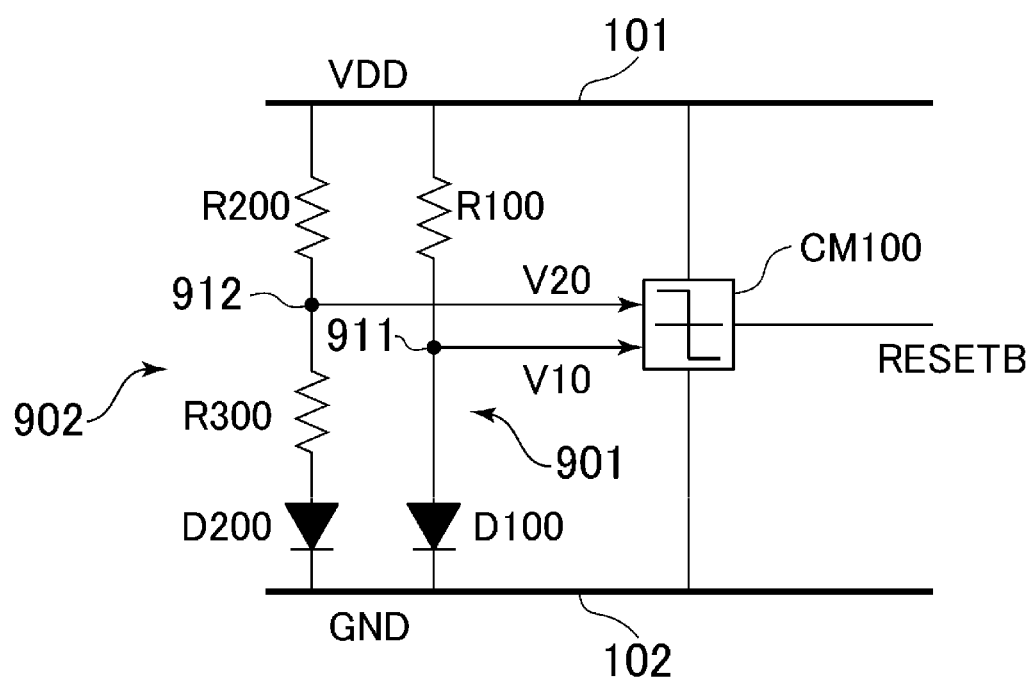

ND WIRELESS
SEMICONDUCTOR DEVICE AND WIRELESS COMMUNICATION DEVICE

CROSS-REFERENCE TO RELATED APPLICATION

The disclosure of Japanese Patent Application No. 2013-043284 filed on Mar. 5, 2013 including the specification, drawings and abstract is incorporated herein by reference in its entirety.

BACKGROUND

The present invention relates to a semiconductor device and a wireless communication device, in particular, to a semiconductor device and a wireless communication device including a power-on reset circuit.

A power-on reset circuit is used to prevent an internal state of a logic circuit from being indeterminate when the power is turned on. The power-on reset circuit detects a rise of the power and supplies a reset signal RESET or an inverted signal thereof RESETB to the logic circuit. As an example of the power-on reset circuit, FIG. 1 shows a conceptual diagram of a circuit described in Japanese Patent Laid-Open No. 1991-48519 (See Patent Document 1).

As shown in FIG. 1, the power-on reset circuit described in Patent Document 1 includes two diode circuits 901 and 902 formed between a VDD terminal 101 and a GND terminal 102 and a comparator CM100 for detecting a voltage difference between voltage detection nodes 911 and 912 of the diode circuits 901 and 902. The diode circuit 901 includes a resistor R100 and a pn junction diode D100 which are connected in series between the VDD terminal 101 and the GND terminal 102. The cathode of the diode D100 is coupled to the GND terminal 102 and the anode thereof is coupled to the VDD terminal 101 through the resistor R100 to be the voltage detection node 911. The diode circuit 902 includes resistors R200 and R300 and a pn junction diode D200 which are connected in series between the VDD terminal 101 and the GND terminal 102. The cathode of the diode D200 is coupled to the GND terminal 102 and the anode thereof is coupled to the VDD terminal 101 through the resistors R300 and R200. The coupling node between the resistors R200 and R300 is the second voltage detection node 912. The comparator CM100 outputs a comparison result between an output voltage V10 outputted from the voltage detection node 911 and an output voltage V20 outputted from the voltage detection node 912 as a reset signal RESETB.

An example of a setting method of parameters of each element in the power-on detection circuit shown in FIG. 1 will be described. Here, the resistances of the resistors R100, R200, and R300 are defined as "R100", "R200", and "R300" respectively. As a typical setting example of each element parameter, there is a method in which the resistances of resistors R100 and R200 are set to be the same ("R100=R200"), the size ratio between the diodes D100 and D200 is set to be 1:N, and an appropriate value of "R300" is set. Alternatively, there is a setting method in which a ratio between a product of the size of the diode D100 and the value "R200" of the resistor R200 and a product of the size of the diode D200 and the value "R100" of the resistor R100 is set to be 1:N and the value "R300" of the resistor R300 is set appropriately.

FIG. 2A shows response characteristics of the output voltages V10 and V20 with respect to the power supply voltage VDD in the circuit shown in FIG. 1. As shown in FIG. 2A, when the power supply voltage VDD rises from zero, an external voltage (here, the power supply voltage VDD) almost directly becomes the output voltages V10 and V20 (from time T0 to time T10) because no current flows through the diodes D100 and D200 at a voltage lower than or equal to the forward drop voltage "VF" of the diodes. Further, when the voltage becomes higher than "VA", the current through the diode D200 with a larger size becomes non-negligible and the increase of the output voltage V20 becomes gradual. When the voltage is raised further, the current through the diode D100 with a smaller size also becomes non-negligible and the increase of the output voltage V10 also becomes gradual. When the voltage is raised further, while the output voltage V10 rises by an increase of the voltage across terminals of the diode D100, the output voltage V20 rises by an increase of the sum of the voltage across terminals of the diode D200 and the voltage across terminals of the resistor R300. Therefore, the rate of the increase of the output voltage V20 is higher than that for the output voltage V10. The magnitude correlation of the output voltages V10 and V20 changes at the point where the power supply voltage becomes the voltage VB (time T20).

Here, FIG. 2B shows response characteristics of the comparator CM100 with respect to the power supply voltage VDD. As shown in FIGS. 2A and 2B, since the magnitude correlation of the output voltages V10 and V20 is indeterminate from the time T0 to the time T10, the value (signal level) of the output (reset signal RESETB) of the comparator CM100 may become indeterminate. However, it is not matter in practice since the reset signal RESETS with an appropriate signal level (low level) for the power-on reset operation is outputted after the time T10. Since the rate of increase in the output voltage V20 decreases earlier than that for the output voltage V10, "V10>V20" is established at the time T10, and the reset signal RESETB indicates a low level "VL (GND level)". When the power supply voltage VDD rises further and exceeds a predetermined voltage "VB" at the time T20, the output voltage V20 with a higher rise rate exceeds the output voltage V10 and "V10<V20" is established. Thereby, the reset signal RESETB changes to an expected value that indicates a high level. In a period of time from T20 to the time T30 at which the power supply voltage VDD becomes a predetermined voltage VC (an expected value of the power supply voltage VDD), the reset signal RESETS rises with "VH (VDD level)". When the power supply voltage VDD becomes stable at the voltage VC, the reset signal RESETB also becomes stable at the "VH (VDD level)".

It is known that if the size ratio between the diode D100 and the diode D200 and the value of the resistor R300 are appropriately selected, the voltage VB when "V10=V20" is established becomes a band gap voltage VBG of silicon and the effects of variations of temperature and elements can be reduced. In other words, the present circuit has an advantage to be tolerant to element variation and temperature variation. It is possible to adjust the voltage VB while controlling the effects of variations of temperature and elements within an allowable range by further appropriately changing circuit parameters from the state described above. In summary, the present circuit satisfies requirements for the power-on reset circuit.

A semiconductor device that can stably detect power-on regardless of parameters of voltage rising and a voltage level of an external power supply voltage is described in Japanese Patent Laid-Open No. 2005-109659 (See Patent Document 2). The semiconductor device described in Patent Document 2 delays a power-on signal with respect to a rapidly rising external power supply voltage by connecting a capacitance element to each of the diodes D100 and D200 shown in FIG. 1 in parallel.

SUMMARY

As shown in FIG. 3, the diodes D100 and D200 in the circuit shown in FIG. 1 have junction capacitances CP10 and CP20 respectively. The rise times of the output voltages V10 and V20 delay by the time constants due to the junction capacitances CP10 and CP20. Therefore, if the rise of the power supply voltage VDD is rapid, the power supply voltage VDD may become an expected value (voltage VC) before the output voltage V20 exceeds the output voltage V10. For example, FIG. 4 shows a relationship between the power supply voltage VDD and the output voltages V10 and V20, where a period of time between the time T0, at which the power supply voltage VDD starts to rise, and the time T3, at which the power supply voltage VDD reaches the voltage VC, is close to the time constant determined by the junction capacitance CP10 and the resistor R100 and the time constant determined by the sum of the resistances of R200 and R300 and the junction capacitance CP20. In this case, even when the power supply voltage VDD becomes a desired voltage VC, the output voltage V20 does not exceed the output voltage V10 and the output level of the comparator CM100 does not change. In other words, when the rise of the power supply voltage VDD is rapid, the change of the reset signal RESETB to the high level occurs later than the completion of the rise of the power supply voltage VDD. This becomes a problem in a use in which the rise of the power supply voltage VDD is assumed to be rapid and the delay time from the power supply voltage (VDD) rise to the reset removal is defined to be relatively short. To shorten the time constants to solve this problem, it is necessary to select the smaller resistances of resistors R100 and R200. However, in this case, another problem occurs, that is, an increase in the current consumption of the power-on reset circuit.

Therefore, it is required to realize optimal power-on reset in a system in which the rise of the power supply voltage is rapid. Further, it is required to realize optimal power-on reset in a system in which the rise of the power supply voltage is rapid while suppressing the increase in the current consumption.

A semiconductor device according to the present embodiment includes two diodes, which are connected in parallel between power supplies, and resistor circuits and capacitor elements, which are connected in parallel between one power supply and each of the two diodes, and outputs a comparison result between voltages from the two resistor circuits as a reset signal.

The present invention realizes power-on reset in a system in which the rise of the power supply voltage is rapid while suppressing the increase of the current consumption.

BRIEF DESCRIPTION OF THE DRAWINGS

FIG. 1 is a diagram showing a configuration of a semiconductor device according to a related art;

DETAILED DESCRIPTION (Overview)

Figure 2A:
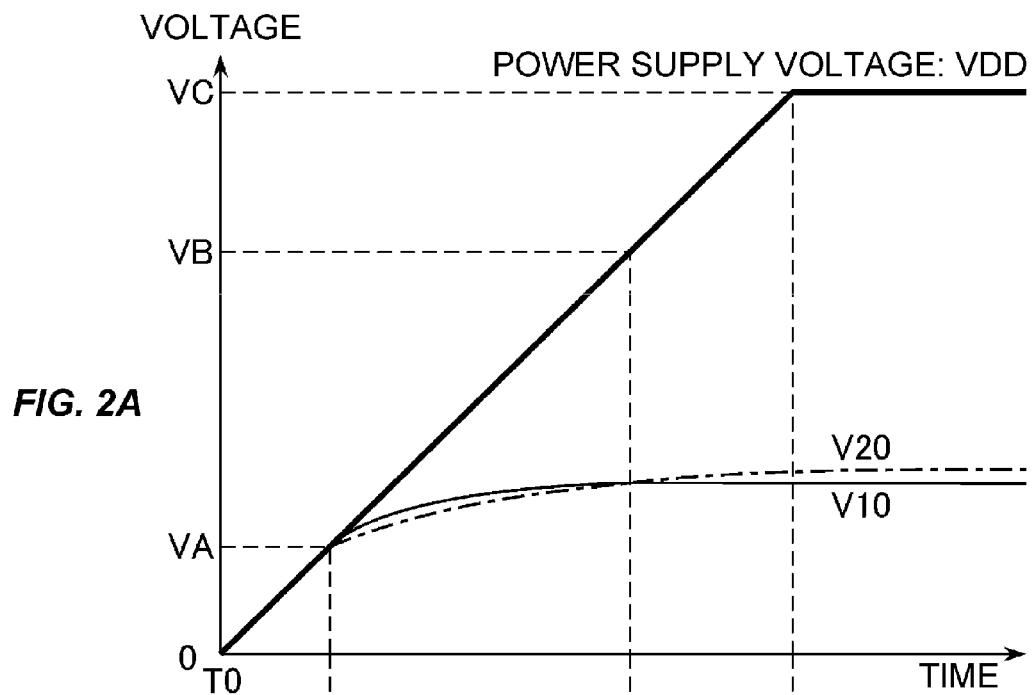
FIG. 2A is a diagram showing response characteristics of output voltages with respect to a power supply voltage in a circuit shown in FIG. 1.

A semiconductor device according to a first embodiment detects a rise of a power supply voltage by using a voltage difference according to a difference between currents of two diodes. Here, the semiconductor device according to the embodiment includes capacitance elements connected in parallel to current paths (resistor circuits) of currents flowing through two diodes respectively. Since the power supply and the diode are AC-coupled through the capacitance element, when the power supply voltage rises rapidly, a voltage (hereinafter also referred to as a detection voltage) detected by the current path (resistor circuit) also rises (increases) rapidly. Thereby, even when the rise of the power supply voltage is rapid, it is possible to output a power-on reset signal (reset release signal) following the rise of the power supply voltage.

At this time, it is not necessary to change the resistance value of the current path, and thus increase of the current consumption is suppressed.

Hereinafter, embodiments of the present invention will be described with reference to the drawings. In the drawings, the same or similar reference signs denote the same, similar, or equivalent components. In the description below, a reference voltage supplied from a reference power supply for the low voltage side is described as a ground GND. However, needless to say, the reference voltage is not limited to the ground GND if the reference voltage is lower than the power supply voltage VDD supplied from a voltage supply for the high voltage side.

1. First Embodiment (Configuration)

Figure 5:
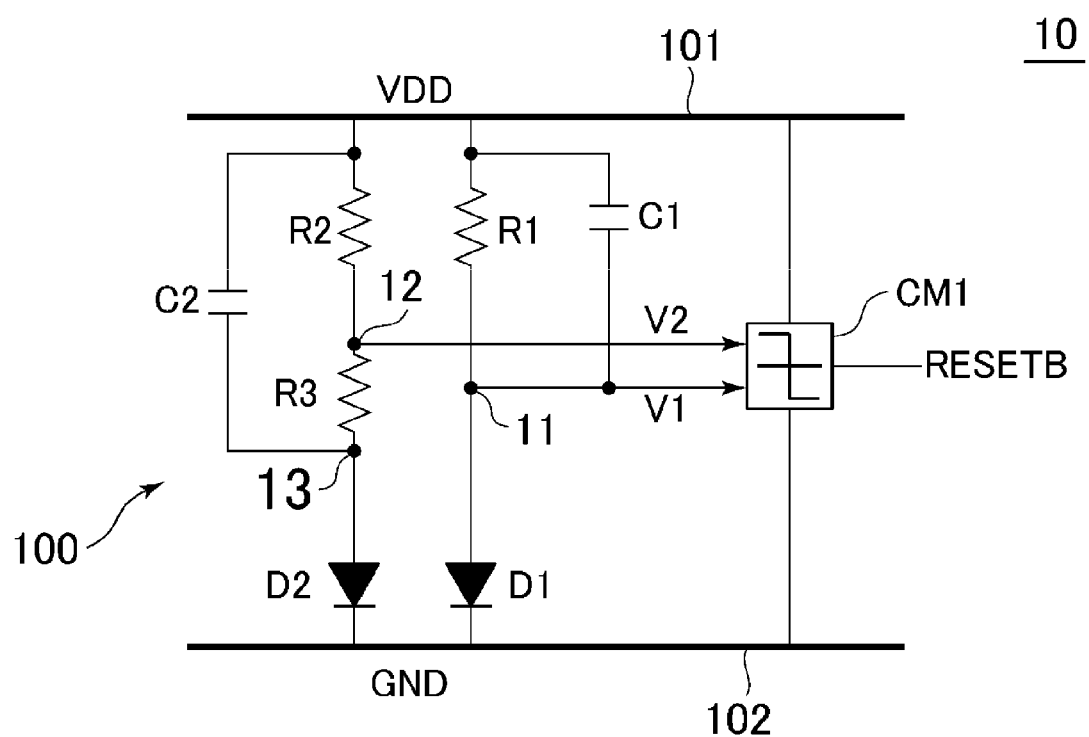
FIG. 5 is a diagram showing an example of a configuration of a semiconductor device according to a first embodiment.

A semiconductor device 10 according to a first embodiment will be described with reference to FIGS. 5, 6A and 6B. FIG. 5 is a diagram showing an example of a configuration of the semiconductor device 10 according to the first embodiment. As shown in FIG. 5, the semiconductor device 10 includes a detection voltage generation circuit 100 and a comparator circuit CM1. The detection voltage generation circuit 100 includes diodes D1 and D2, such as for example PN junction diodes, resistor elements R1, R2, and R3, and capacitor elements C1 and C2. Specifically, the diodes D1 and D2 are connected in parallel in the forward direction between a power supply node 101 to which a power supply voltage VDD is supplied and a ground node 102 of a ground voltage GND. The resistor element R1 (first resistor circuit) and the capacitor element C1 are connected in parallel between the anode (node 11) of the diode D1 and the power supply node 101, and a voltage at the node 11 is inputted into the comparator circuit CM1 as a detection voltage V1. The cathode of the diode D1 is coupled to the ground node 102. The resistor elements R2 and R3 connected in series (second resistor circuit) and the capacitor element C2 are connected in parallel between the anode (node 13) of the diode D2 and the power supply node 101, and a voltage at a coupling node (node 12) between the resistor element R2 and the resistor element R3 is inputted into the comparator circuit CM1 as a detection voltage V2. The cathode of the diode D2 is coupled to the ground node 102. The comparator circuit CM1 binarizes a comparison result between the detection voltage V1 from the node 11 and the detection voltage V2 from the node 12 and outputs the binarized comparison result as a reset signal RESETB. Although a hysteresis comparator is preferably used as the comparator circuit CM1, a circuit configuration of the comparator circuit CM1 is not limited if the circuit can binarize the comparison result between the detection voltages V1 and V2.

Parameters for the resistor elements R1, R2, and R3 and the diodes D1 and D2 in the semiconductor device shown in FIG. 5 can be set in the same manner as in the circuit shown in FIG. 1. In the description below, the resistance values of the resistor elements R1, R2, and R3 are defined as "R1", "R2", and "R3" respectively. As a typical setting method of each element parameter, for example, there is a method in which the values of the resistor elements R1 and R2 are set to be the same ("R1=R2"), the size ratio between the diodes D1 and D2 is set to be 1:N, and an appropriate value of "R3" is set. Alternatively, there is a setting method in which a ratio between a product of the size of the diode D1 and the value "R2" of the resistor element R2 and a product of the size of the diode D2 and the value "R1" of the resistor element R1 is set to be 1:N, and the value "R3" of the resistor element R3 is set appropriately.

Figure 3:
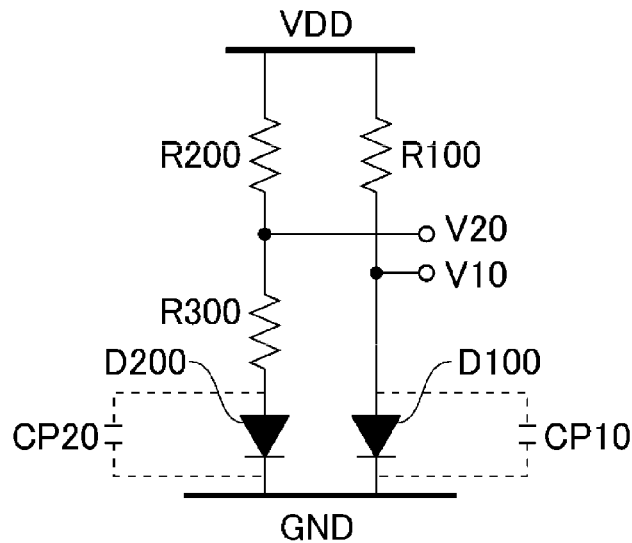
FIG. 3 is a configuration diagram showing a problem of the semiconductor device according to the related art.

Between both ends of each of the diodes D1 and D2, junction capacitances in accordance with the sizes of the diodes D1 and D2 exist in the same manner as the junction capacitances CP10 and CP20 shown in FIG. 3. It is preferable that the capacitance values of the capacitor elements C1 and C2 according to the present embodiment are set to values several times of the junction capacitances (not shown in the drawings) for the diodes D1 and D2 and the capacitance ratio between the capacitor elements C1 and C2 is set to substantially the same value as (or an approximate value of) the size ratio between the diodes D1 and D2.

With the above-described configuration, the semiconductor device 10 according to the embodiment outputs a low-level reset signal RESETB when the power supply voltage VDD is lower than a predetermined level, and when the power supply voltage VDD exceeds the predetermined level, the semiconductor device 10 detects it and outputs a high-level reset signal RESETB. For example, an internal circuit not shown in the drawings is in a reset state by the low-level reset signal RESETB and the reset state of the internal circuit is released by the high-level reset signal RESETB. In other words, the semiconductor device 10 according to the embodiment functions as a power-on reset circuit.

(Operation)

Next, an operation of the semiconductor device 10 according to the first embodiment will be described with reference to FIGS. 6A and 6B. In the description below, as an example, an operation of the semiconductor device 10 when the parameters of the resistor elements R1, R2, and R3 and the diodes D1 and D2 are set to the same as the parameters of the resistors R100, R200, and R300 and the diodes D100 and D200 respectively will be described.

Figure 2B:
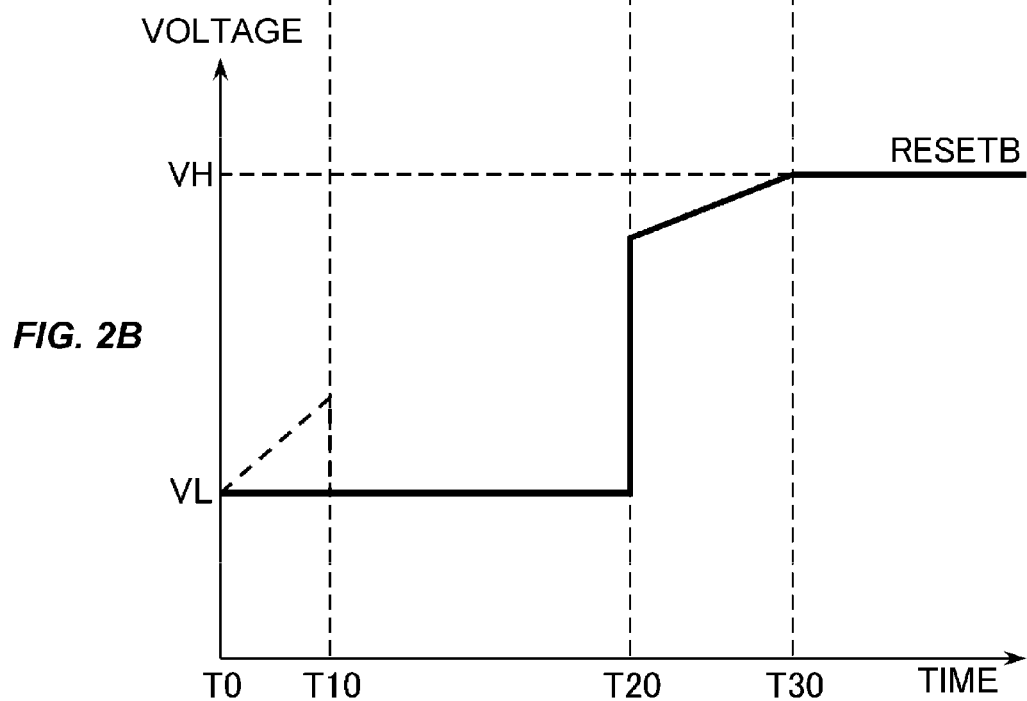
FIG. 2B is a diagram showing response characteristics of a comparator with respect to the power supply voltage in the circuit shown in FIG. 1.
Figure 4:
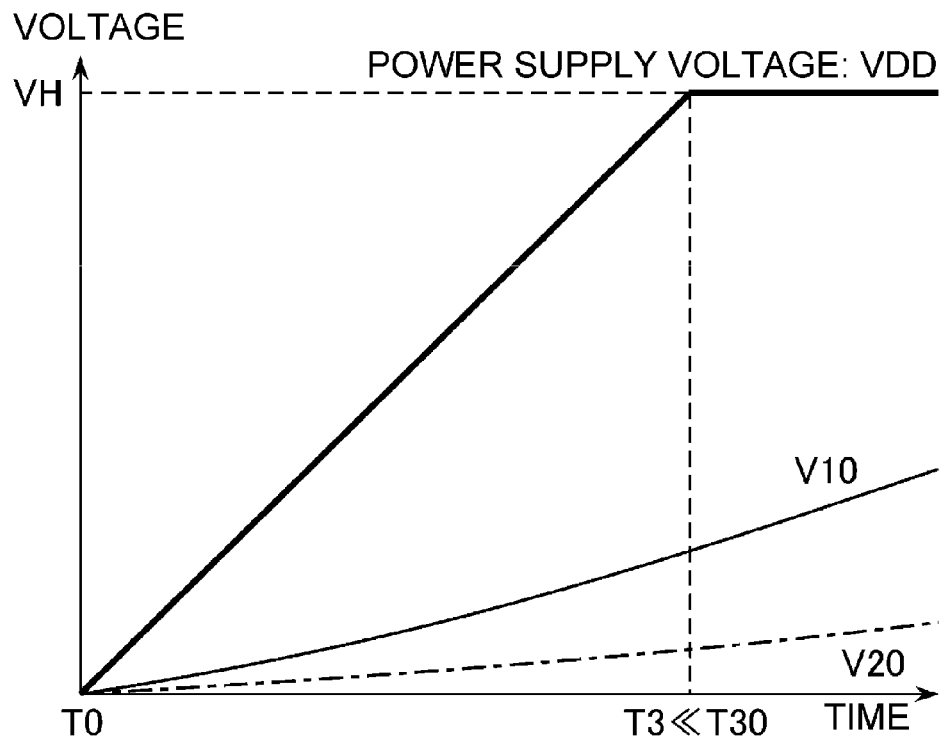
FIG. 4 is a diagram showing response characteristics of output voltages with respect to a power supply voltage in the semiconductor device according to the related art in a case in which the rise of the power supply voltage is sharp.

When the rise time of the power supply voltage VDD to the desired voltage VC is sufficiently long (when the rise is gradual), the existence of capacitor elements C1 and C2 can be ignored, and thus the semiconductor device 10 operates in the same manner as the circuit shown in FIG. 1. For example, when the rise time of the power supply voltage VDD is sufficiently long and the time at which the power supply voltage VDD becomes the desired voltage VC is the same as T30 shown in FIGS. 2A and 2B, the semiconductor device 10 according to the present embodiment operates in the same manner as the operation shown in FIGS. 2A and 2B. An operation when the rise time of the power supply voltage VDD is short and close to the time constant determined by the junction capacitance (not shown in the drawings) of the diode D1 and the resistor element R1 and the time constant determined by the sum of the resistances of the resistor elements R2 and t R3 and the junction capacitance (not shown in the drawings) of the diode D2 will be described with reference to FIGS. 6A and 6B. FIG. 6A is a diagram showing an example of response characteristics of the detection voltages with respect to the power supply voltage in the semiconductor device according to the embodiment. FIG. 6B is a diagram showing an example of response characteristics of the comparator circuit with respect to the power supply voltage in the semiconductor device according to the embodiment. Here, as an example, an operation of the semiconductor device 10 when the time (the rise time) required for the power supply voltage VDD to reach the desired voltage VC is the same as that in FIG. 4 (from time T0 to time T3) will be described.

Figure 6A:
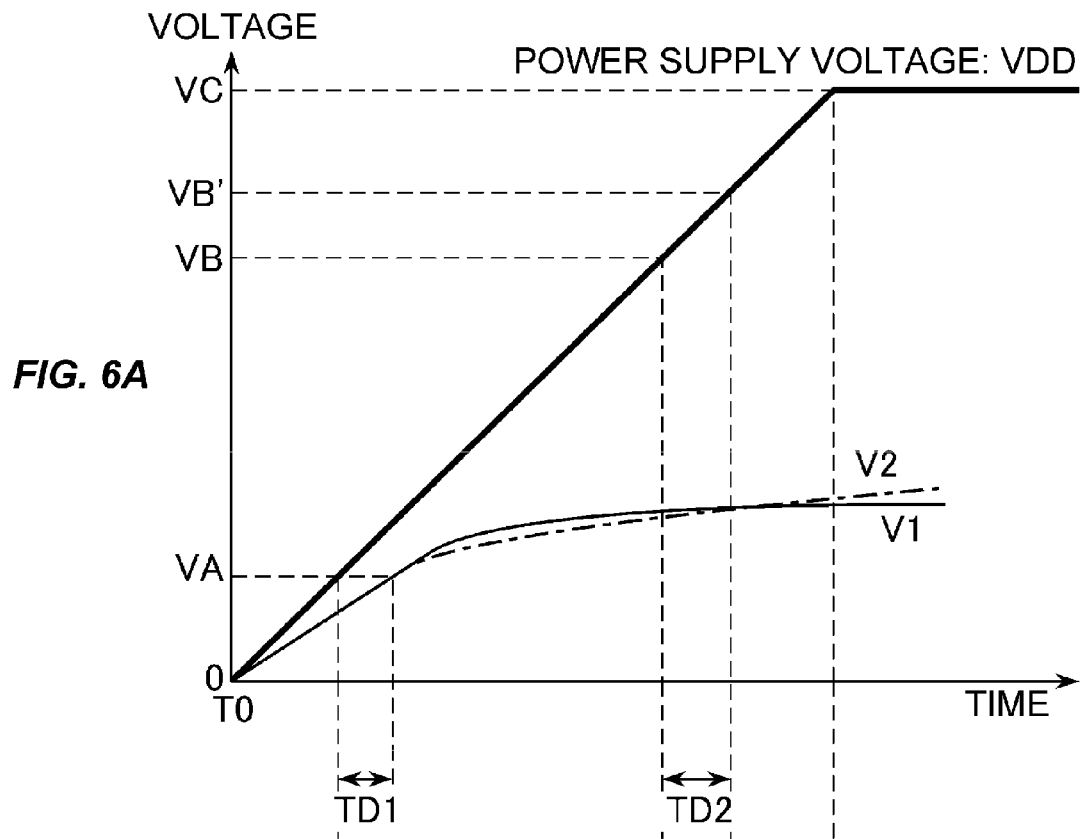
FIG. 6A is a diagram showing an example of response characteristics of detection voltages with respect to a power supply voltage in the semiconductor device according to the first embodiment.

As shown in FIG. 6A, when the power supply voltage VDD rises from zero, the change of the power supply voltage VDD is directly applied to the diodes D1 and D2 through the capacitor elements C1 and C2. Therefore, the detection voltages V1 and V2 rise at a speed so as not to cause a problem in the circuit operation, even though some delay occurs with respect to the rise of the power supply voltage VDD. Specifically, since the power supply voltage VDD is applied to the diodes D1 and D2 through AC coupling by the capacitance elements C1 and C2, the detection voltages V1 and V2 rise with a small amount of delay with respect to the power supply voltage VDD. For example, the time T1, at which the values of the detection voltages V1 and V2 become "VA", is delayed by the amount of time TD1 from the time T11, at which the power supply voltage VDD becomes "VA". However, the amount of delay (the amount of time TD1) is determined by a time constant determined by a product of the capacitance of the capacitor element C1 and the differential resistance of the diode D1 and a time constant determined by a product of the capacitance of the capacitor element C2 and the differential resistance of the diode D2, and the amount of delay can be set to a value sufficiently smaller than the rise time of the power supply voltage VDD.

In the early stage of the rise of the power supply voltage VDD, no current flows through the diodes D1 and D2 at a voltage lower than the forward drop voltage "VF" of the diodes, and thus an external voltage (here, the power supply voltage VDD) directly becomes the detection voltages V1 and V2 (from time T0 to time T1). When the voltage becomes higher than "VA", the amount of current flowing through the diode D2 with a larger size becomes non-negligible and the increase of the detection voltage V2 becomes gradual.

When the power supply voltage VDD rises further after the time T1, the amount of current flowing through the diode D1 with a smaller size also becomes non-negligible and the increase of the detection voltage V1 also becomes gradual. When the power supply voltage VDD rises further, while the detection voltage V1 rises by an increase of the voltage across terminals of the diode D1, the detection voltage V2 rises by an increase of the sum of the voltages across terminals of the diode D2 and the resistor element R3. Therefore, the rate of the increase in the detection voltage V2 is higher than that of the detection voltage V1. The magnitude correlation of the detection voltages V1 and V2 is changed at the time T2 at which the power supply voltage VDD becomes the voltage VB'.

Here, the detection voltage V2 exceeds the detection voltage V1 at the time T2 delayed by an amount of time TD2 from the time T12, at which the power supply voltage VDD becomes a predetermined voltage VB. The amount of delay (the amount of time TD2) is determined by a time constant determined by a product of the capacitance of the capacitor element C1 and the differential resistance of the diode D1 and a time constant determined by a product of the capacitance of the capacitor element C2 and the differential resistance of the diode D2, and the amount of delay can be set to a value sufficiently smaller than the rise time of the power supply voltage VDD.

Figure 6B:
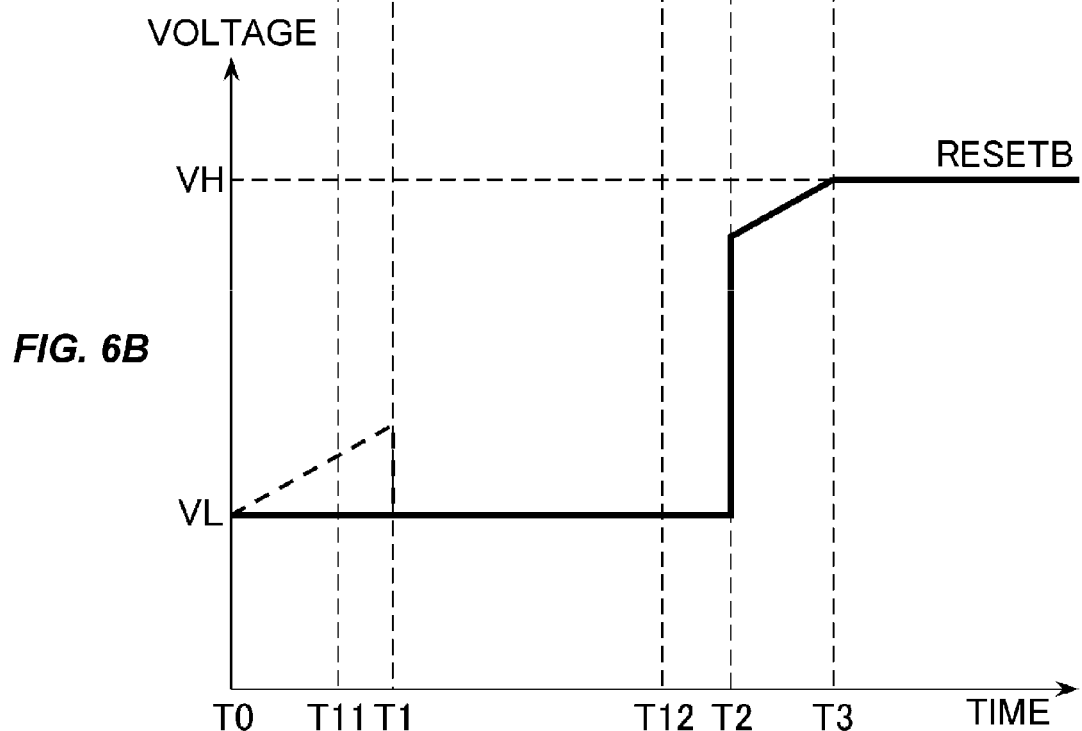
FIG. 6B is a diagram showing an example of response characteristics of a comparator circuit with respect to a power supply voltage in a semiconductor device according to the embodiment.

As shown in FIGS. 6A and 6B, the magnitude correlation of the detection voltages V1 and V2 is indeterminate from the time T0 to the time T1, so that the value (signal level) of the output (reset signal RESETB) of the comparator circuit CM1 may be indeterminate. However, since the reset signal RESETB with an appropriate signal level (low level) for the power-on reset is outputted after the time T1, it does not matter in practice. When the rise rate of the detection voltage V2 decreases earlier than that for V1 and "V1>V2" is established at the time T1, the reset signal RESETB indicates a low level "VL (GND level)". When the power supply voltage VDD rises further and exceeds a predetermined voltage "VB'" at the time T2, the detection voltage V2 with a higher rate of increase exceeds the detection voltage V1 and "V1<V2" is established. Thereby, the reset signal RESETB changes to an expected value that indicates a high level. In a period of time from the time T2 to the time T30, at which the power supply voltage VDD becomes a predetermined voltage VC (an expected value of the power supply voltage VDD), the reset signal RESETB rises to "VH (VDD level)". When the power supply voltage VDD becomes stable at the voltage VC, the reset signal RESETB also becomes stable at the "VH (VDD level)".

If the size ratio between the diodes D1 and D2 and the resistance value of the resistor element R3 are set appropriately, the value of the voltage VB when "V1=V2" is established becomes a band gap voltage VBG of silicon and the effects of variations of temperature and elements can be reduced. In other words, the present circuit has an advantage to be tolerant of element variation and temperature variation in the same manner as the circuit shown in FIG. 1. It is also possible to appropriately adjust the value of the voltage VB' while controlling the effects of variations of temperature and elements within an allowable range by further appropriately changing circuit parameters from the state described above. In summary, the present circuit satisfies the requirements for the power-on reset circuit.

As described above, according to the semiconductor device 10 of the embodiment, even when the rise time of the power supply voltage VDD is short and close to the time constant determined by the junction capacitance (not shown in the drawings) of the diode D1 and the resistance value of the resistor element R1 and the time constant determined by the sum of the resistances of the resistor elements R2 and R3 and the junction capacitance (not shown in the drawings) of the diode D2, it is possible to realize a power-on reset operation whose delay is small. At this time, since it is not necessary to select the smaller resistance values of the resistor elements R1 and R2 in order to reduce the amount of delay, a problem that the current consumption of the power-on reset circuit increases does not occur either.

As described above, in the semiconductor device 10, the differential resistances of the diodes D1 and D2 relate to the amounts of delay of the detection voltages V1 and V2 with respect to the power supply voltage VDD. The differential resistances of the diodes D1 and D2 are sufficiently smaller than the resistance values of the typical resistor elements R1, R2, and R3. In other words, the effects of the time constants due to the circuit components are smaller than those of the circuit shown in FIG. 1. A specific example will be described below using numerical examples.

As an example, a design is assumed in which the resistance value of the resistor element R1 is 1 [MΩ] and a current of about 1 [uA] flows through a branch formed by the resistor element R1 and the diode D1. This corresponds to a design in which the voltage drop in the resistor element R1 is 1 [V]. Generally, the forward differential resistance of a diode is given by kT/qI and is 27 kΩ at a normal temperature with 1 uA. Here, k is a Boltzmann constant, T is a temperature, q is an elementary charge, and I is a current value. The forward differential resistance is as small as, for example, 1/40 times of the value of the resistor element R1. Further, in the actual voltage rise procedure for the power supply voltage VDD, the diodes D1 and D2 and the power supply node 101 are AC-coupled through the capacitance elements C1 and C2, so that a voltage larger than that in a steady state is transiently applied to the diodes D1 and D2. For example, if a terminal voltage of the diode D1 rises by kT/q, the differential resistances of the diode becomes 1/e times (e is the base of natural logarithms). Therefore, in a transient circuit operation, the effective value of the time constant determined by the differential resistance of the diode D1 is further reduced. The same goes for the time constant of the diode D2.

2. Second Embodiment (Configuration)

Figure 7:
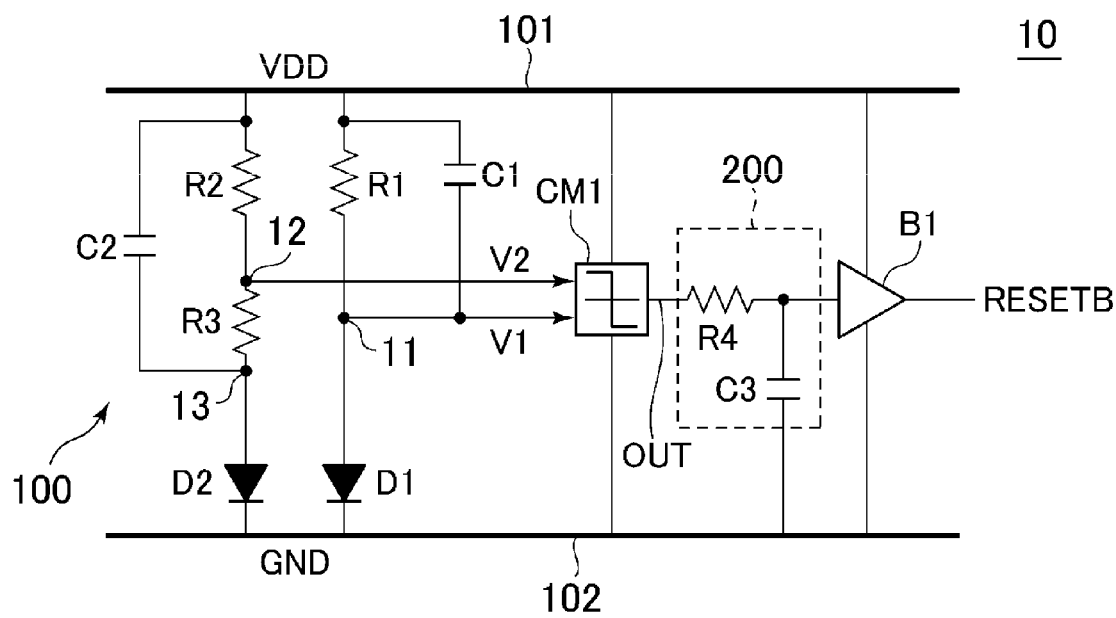
FIG. 7 is a diagram showing another example of a configuration of a semiconductor device according to a second embodiment.

A semiconductor device 10 according to a second embodiment will be described with reference to FIGS. 7 to 9. FIG. 7 is a diagram showing an example of a configuration of the semiconductor device 10 according to the second embodiment. As shown in FIG. 7, the semiconductor device 10 according to the second embodiment includes a CR delay circuit 200 and a buffer circuit B1 in addition to the detection voltage generation circuit 100 and the comparator circuit CM1 shown in FIG. 5. The CR delay circuit 200 forms a CR time constant circuit including a resistor element R4 and a capacitor element C3 connected in series between the output terminal of the comparator circuit CM1 and the ground node 102. The buffer circuit B1 uses the power supply voltage VDD and the ground GND for operation. The input terminal of the buffer circuit B1 is coupled to the coupling node between the resistor element R4 and the capacitor element C3 and the reset signal RESETB is outputted from the output terminal. The configurations of the detection voltage generation circuit 100 and the comparator circuit CM1 are the same as those in the first embodiment, so that the description thereof will be omitted.

(Operation)

Next, an operation of the semiconductor device 10 according to the second embodiment will be described with reference to FIGS. 8A and 8B. In the description below, as an example, an operation of the semiconductor device 10 when the constants of the resistor elements R1, R2, and R3 and the diodes D1 and D2 are set to the same as the constants of the resistors R100, R200, and R300 and the diodes D100 and D200 respectively will be described.

When the rise time of the power supply voltage VDD to a desired voltage VC is sufficiently long (when the rise is gradual) or when the rise time of the power supply voltage VDD is short and close to the time constant determined by the junction capacitance (not shown in the drawings) of the diode D1 and the resistance value of the resistor element R1 and the time constant determined by the sum of the resistances of the resistor elements R2 R3 and the junction capacitance (not shown in the drawings) of the diode D2, the semiconductor device 10 operates in the same manner as in the first embodiment. However, in the present embodiment, the output signal from the comparator circuit CM1 is delayed by the CR delay circuit 200 and thereafter outputted from the buffer circuit B1.

Next, an operation when the rise time of the power supply voltage VDD is further reduced to be short and close to the time constant determined by the capacitor element C1 and the differential resistance of the diode D1 and the time constant determined by the capacitor element C2 and the differential resistance of the diode D2 will be described with reference to FIGS. 8A, 8B and 9. FIG. 8A is a diagram showing another example of response characteristics of the detection voltages with respect to the power supply voltage in the semiconductor device according to the embodiment. FIG. 8B is a diagram showing another example of response characteristics of the comparator circuit with respect to the power supply voltage in the semiconductor device according to the embodiment.

Figure 8A:
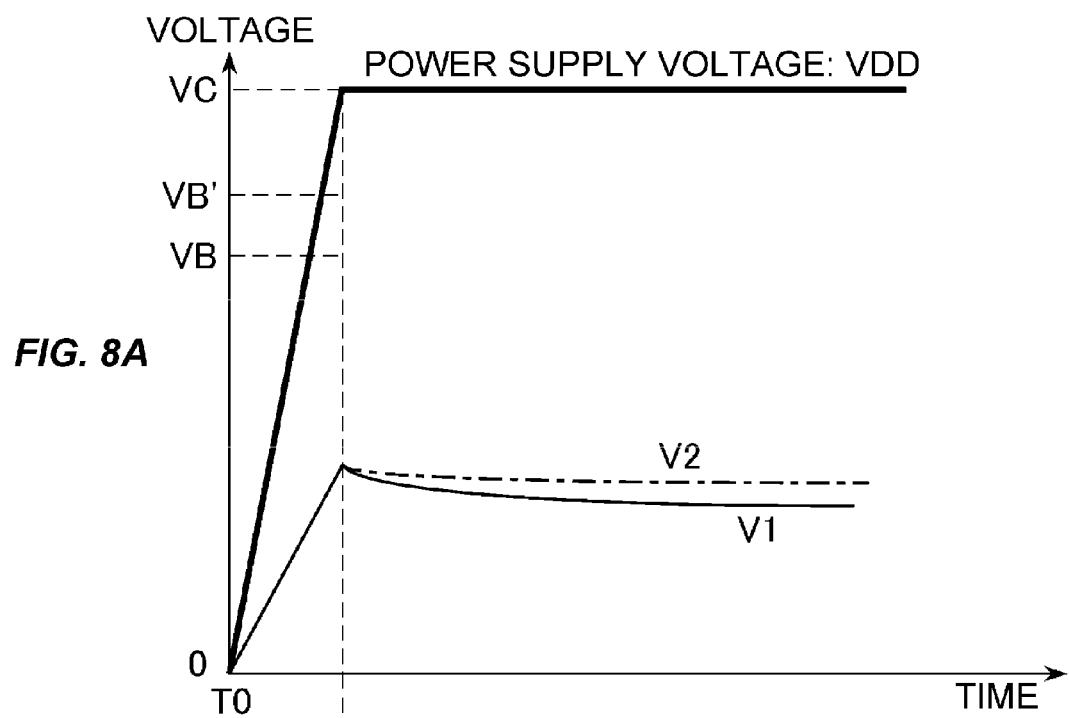
FIG. 8A is a diagram showing another example of response characteristics of detection voltages with respect to a power supply voltage in the semiconductor device according to the second embodiment.
Figure 8B:
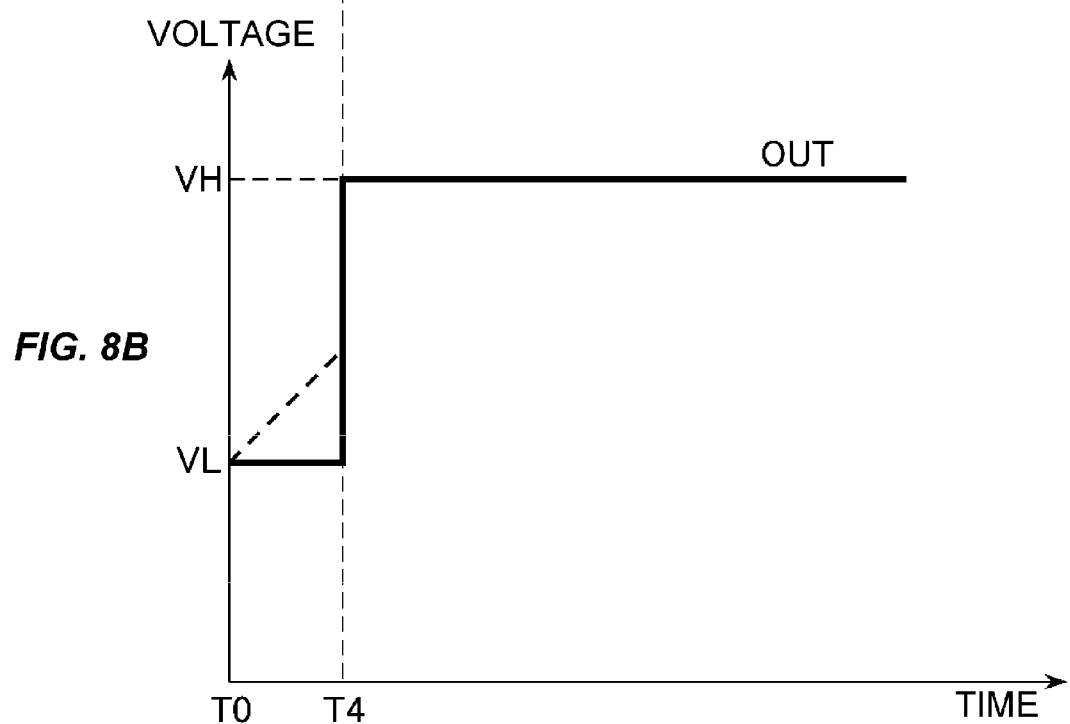
FIG. 8B is a diagram showing another example of response characteristics of a comparator circuit with respect to a power supply voltage in a semiconductor device according to the embodiment.
Figure 9:
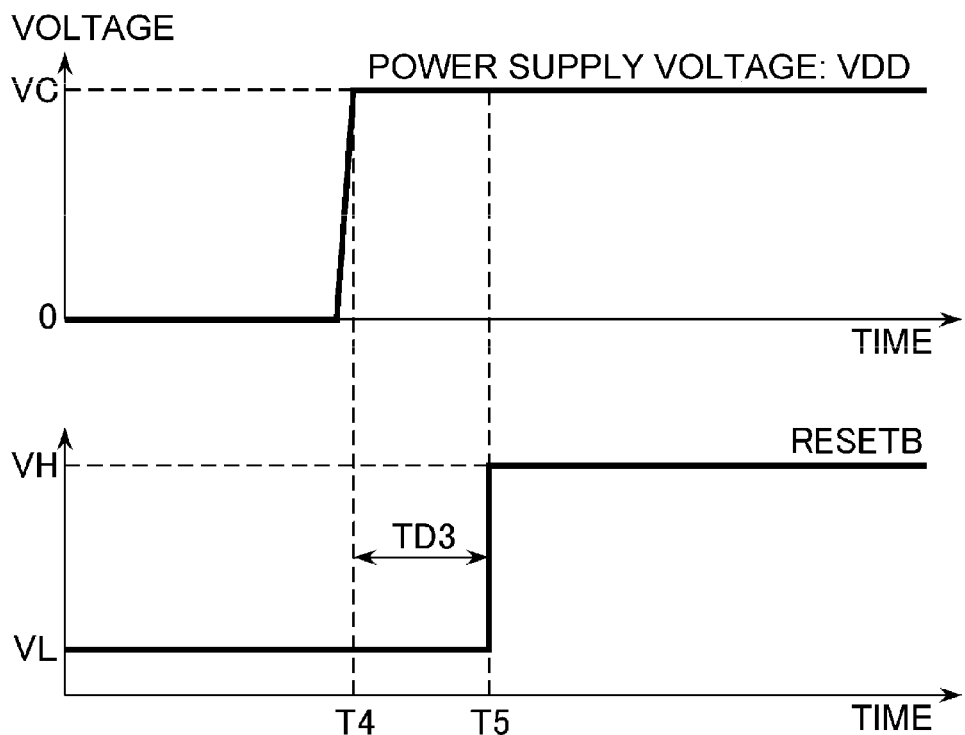
FIG. 9 is a diagram showing an example of response characteristics of a reset signal with respect to the power supply voltage in the semiconductor device shown in FIGS. 8A and 8B.

As shown in FIG. 8A, when the power supply voltage VDD rises from zero, the change of the power supply voltage VDD is directly applied to the diodes D1 and D2 through the capacitor elements C1 and C2. Therefore, the detection voltages V1 and V2 rise rapidly by the effects of AC coupling of the capacitor elements C1 and C2 (time T0-time T4) even though some delay occurs with respect to the rise of the power supply voltage VDD. At this time point, the magnitude correlation of the detection voltages V1 V2 is not clear, so that the signal level of the output signal OUT of the comparator circuit CM1 is indeterminate. At the time T4 at which the power supply voltage VDD becomes a desired voltage VC, each of the detection voltage V1 and the detection voltage V2 overshoots the steady state thereof. The reason of this is because the charging time constants of the capacitor elements C1 and C2 are non-negligibly long as compared with the rise time of the power supply voltage VDD. Therefore, when the power supply voltage VDD becomes stable at the voltage VC, the capacitance elements C1 and C2 are rapidly charged through the diodes D1 and D2 and each of the detection voltages V1 and V2 converges into a steady-state output value thereof.

At the time T4, the power supply voltage VDD exceeds the voltage VB' at which the detection voltage V2 described above conversely exceeds the detection voltage V1. Thus, after the time T4, the state of the detection voltages V1 and V2 is directly changed to a state that the detection voltage V2 exceeds the detection voltage V1, that is, "V2>V1". As a result, there is no period of time in which "V2<V1" is clearly established, so that there is no period of time in which the output signal OUT of the comparator circuit CM1 is surely low level. However, the CR delay circuit 200 is coupled to the output of the comparator circuit CM1, so that as shown in FIG. 9, the reset signal RESETB outputted from the buffer circuit B1 changes to a high level at the time T5 delayed from the time T4 by the time constant of the CR delay circuit 200. Therefore, according to the present embodiment, even if the rise time of the power supply voltage VDD is very short, it is possible to obtain the reset signal RESETB that satisfies the requirements in the power-on reset operation. This effect can be obtained even when the rise time of the power supply voltage VDD is nearly zero.

From the above, the semiconductor device 10 according to the present embodiment can stably obtain a desired operation as a power-on reset circuit even when the rise time of the power supply voltage VDD is very long or nearly zero.

Next, modifications of the detection voltage generation circuit 100 in the embodiment will be described with reference to FIGS. 10 to 14. In the description below, modifications of the detection voltage generation circuit 100 of the semiconductor device 10 in the first and the second embodiments will be described.

Figure 10:
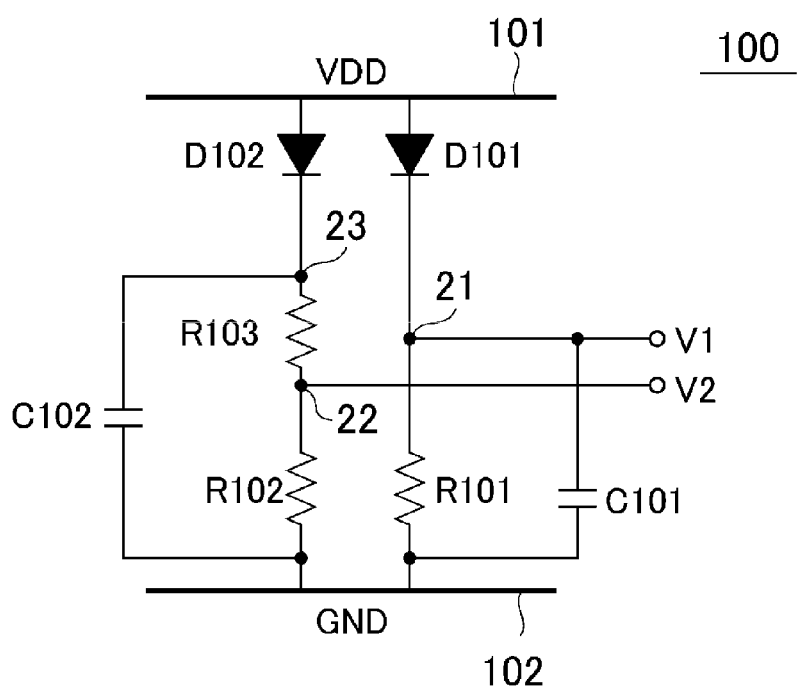
FIG. 10 is a diagram showing a modification of a configuration of a detection voltage generation circuit according to the embodiments.

FIG. 10 is a diagram showing a modification of the configuration of the detection voltage generation circuit 100 according to the embodiments. In the detection voltage generation circuit 100 shown in FIGS. 5 and 7, the resistor elements and the capacitor elements are provided on the high-voltage power supply side and the diodes are provided on the low-voltage power supply side. However, the detection voltage generation circuit 100 shown in FIG. 10 has a configuration reverse to that described above. Specifically, the detection voltage generation circuit 100 shown in FIG. 10 includes diodes D101 and D102, such as for example PN junction diodes, resistor elements R101, R102, and R103, and capacitor elements C101 and C102. The diodes D101 and D102 are connected in parallel in the forward direction between a power supply node 101 to which a power supply voltage VDD is supplied and a ground node 102 of a ground GND. The resistor element R101 (first resistor circuit) and the capacitor element C101 are connected in parallel between the cathode (node 21) of the diode D101 and the ground node 102, and a voltage of the node 21 is inputted into the comparator circuit CM1 (not shown) as a detection voltage V1. The anode of the diode D101 is coupled to the power supply node 101. The resistor elements R102 and R103 connected in series (second resistor circuit) and the capacitor element C102 are connected in parallel between the cathode (node 23) of the diode D102 and the ground node 102, and a voltage of a coupling node (node 22) between the resistor elements R102 and R103 is inputted into the comparator circuit CM1 as a detection voltage V2. The anode of the diode D102 is coupled to the power supply node 101.

Also in this configuration, in the same manner as in the first and the second embodiments, the power supply and the diodes D101 and D102 are AC coupled through the capacitor elements C101 and C102 connected in parallel to the current paths of the currents for the two diodes D101 and D102. Therefore, the rate of rise of the detection voltages V1 and V2 increases. Thereby, even when the rise of the power supply voltage is rapid, it is possible to output a power-on reset signal following the rise of the power supply voltage. The configuration shown in FIG. 10, that is, the configuration in which the position of the resistor elements and the capacitor elements and the position of the diodes are reversed with respect to the power supply from the configurations shown in FIGS. 5 and 7 can also be applied to configurations shown in FIGS. 11 to 14.

Figure 11:
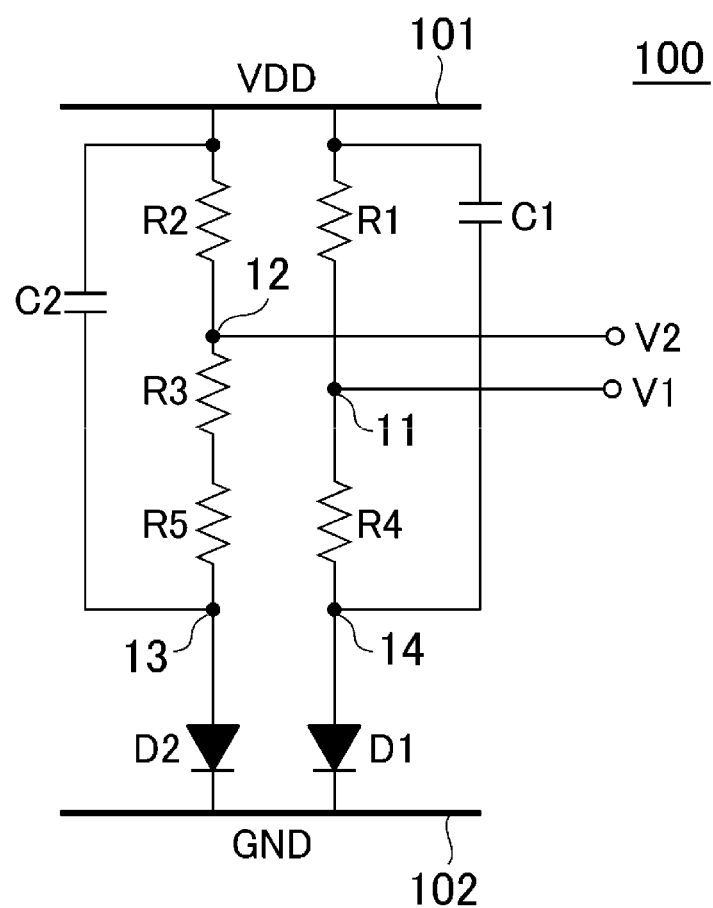
FIG. 11 is a diagram showing another modification of the configuration of the detection voltage generation circuit according to the embodiments.
Figure 12:
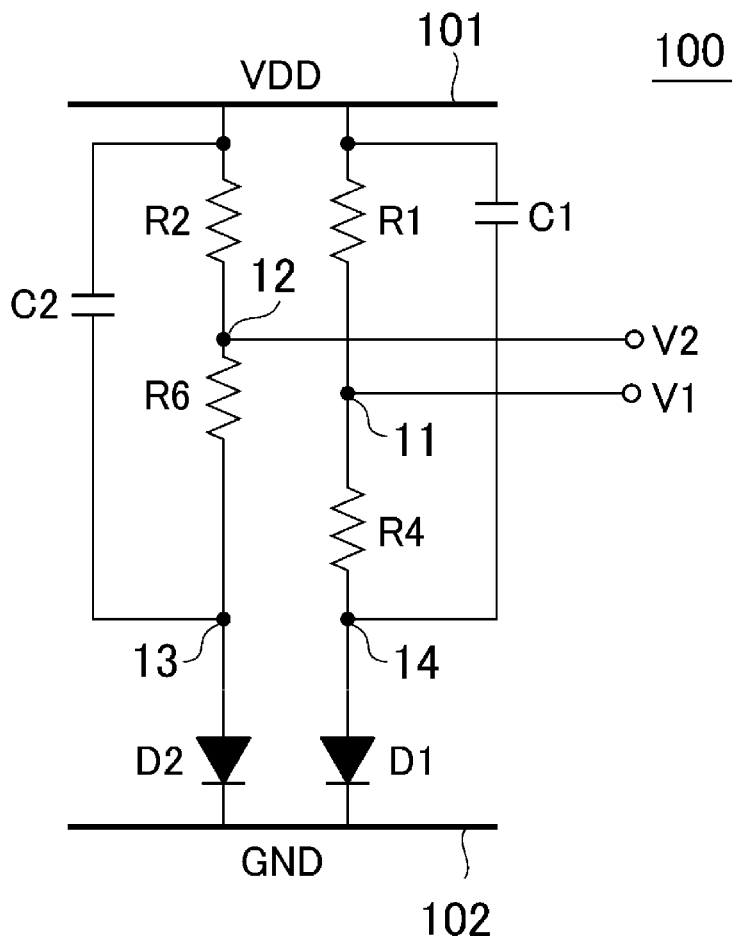
FIG. 12 is a diagram showing further another modification of the configuration of the detection voltage generation circuit according to the embodiments.

FIG. 11 is a diagram showing another modification of the configuration of the detection voltage generation circuit 100 according to the embodiments. The detection voltage generation circuit 100 further includes resistor elements R4 and R5 which are inserted between the diodes D1 and D2 and the nodes 11 and 12 from which the detection voltages V1 and V2 are outputted in the detection voltage generation circuit 100 shown in FIGS. 5 and 7. Specifically, the resistor element R4 is inserted between the resistor element R1 (node 11) and the anode (node 14) of the diode D1 and the resistor element R5 is inserted between the resistor element R3 and the anode (node 13) of the diode D2. The capacitor element C1 is coupled between the power supply node 101 and the node 14, and the capacitor element C2 is coupled between the power supply node 101 and the node 13. In other words, in the modification of the present embodiments, a first resistor circuit formed by the resistor elements R1 and R4 and the capacitor element C1 are connected in parallel between the power supply node 101 and the node 14, and a second resistor circuit formed by the resistor elements R2, R3, and R5 and the capacitor element C2 are connected in parallel between the power supply node 101 and the node 13. Typically, it is preferable that the resistance ratio between the resistor elements R1 and R2 is the same as the resistance ratio between the resistor elements R4 and R5. It is possible to more flexibly adjust a voltage difference between the detection voltages V1 and V2 and the absolute value of the voltage difference by adding the resistor element R4. It goes without saying that the same effect can be obtained when a plurality of the resistor elements R3 and R5 is replaced by one resistor element R6 as shown in FIG. 12 if the resistance value between the node 12 and the node 13 shown in FIG. 11 is the same.

Figure 13:
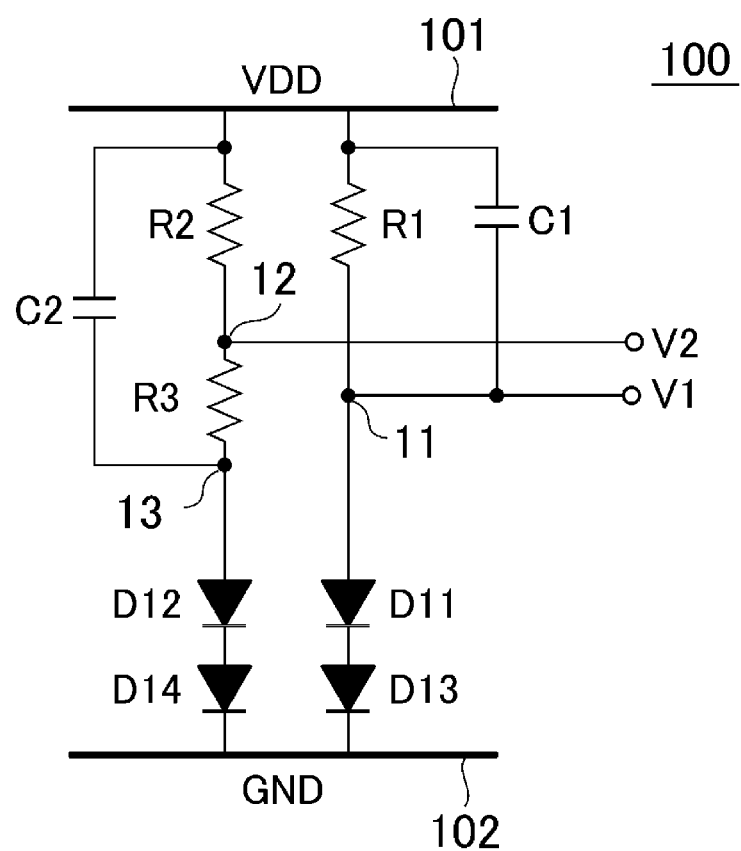
FIG. 13 is a diagram showing further another modification of the configuration of the detection voltage generation circuit according to the embodiments.

FIG. 13 is a diagram showing further another modification of the configuration of the detection voltage generation circuit 100 according to the embodiments. The detection voltage generation circuit 100 shown in FIG. 13 includes a plurality of diodes D11, D12, D13, and D14 instead of the diodes D1 and D2 shown in FIGS. 5 and 7. Specifically, a plurality of the diodes D11 and D13 connected in series in the forward direction is inserted between the node 11 and the ground node 102 and a plurality of the diodes D12 and D14 connected in series in the forward direction is inserted between the node 13 and the ground node 102. The other configuration is the same as that shown in FIGS. 5 and 7. It goes without saying that if the circuit constant is appropriately selected, the same effect is obtained even if the number of diodes is changed. The same goes for a case in which the number of diodes connected in series is three or more.

Figure 14:
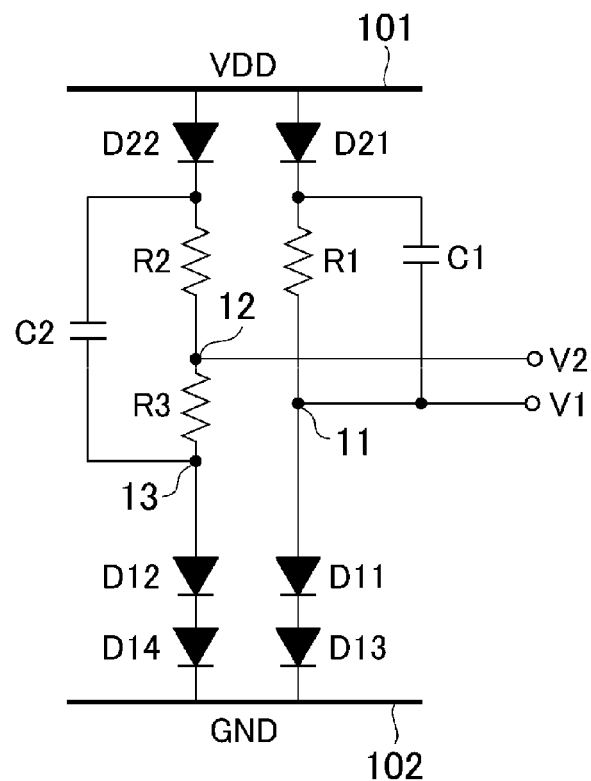
FIG. 14 is a diagram showing further another modification of the configuration of the detection voltage generation circuit according to the embodiments.

FIG. 14 is a diagram showing further another modification of the configuration of the detection voltage generation circuit 100 according to the embodiments. The detection voltage generation circuit 100 shown in FIG. 14 further includes diodes D21 and D22 in addition to the components of the detection voltage generation circuit 100 shown in FIG. 13. Specifically, the diode D21 is coupled in the forward direction between the power supply node 101 and a coupling node of the resistor element R1 and the capacitor element C1, and the diode D22 is coupled in the forward direction between the power supply node 101 and a coupling node of the resistor element R2 and the capacitor element C2. The other configuration is the same as that shown in FIG. 13. In this way, diodes may be provided not only on the side of the ground node 102 but also on the side of the power supply node 101 for the resistor elements and the capacitor elements. Typically, it is preferable that the size ratio between the diodes D21 and D22 is the same as the inverse ratio between the resistances of the resistor elements R1 and R2. It is possible to more flexibly adjust the voltage difference between the detection voltages V1 and V2 and the absolute value of the voltage difference by adding the diodes D21 and D22. The number of the diodes connected in series is not limited to the number of the diodes connected in series shown in FIG. 14.

Figure 15:
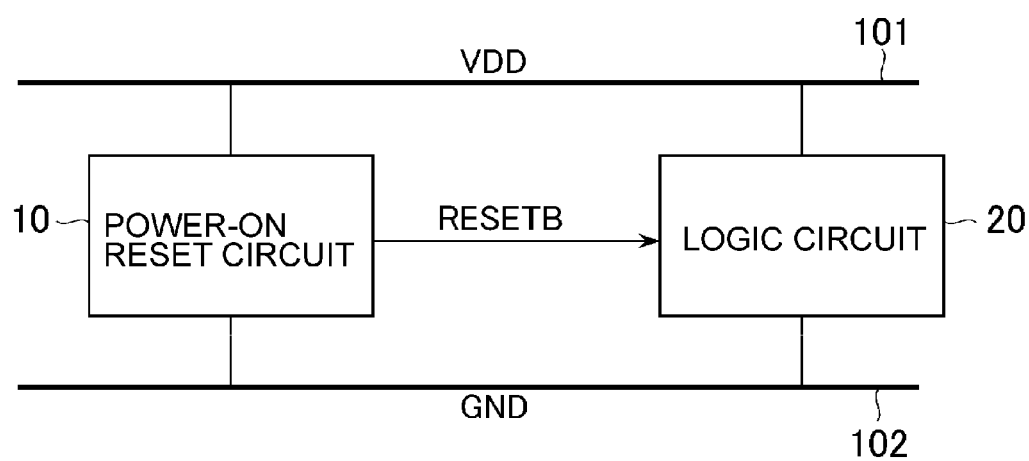
FIG. 15 is a diagram showing an example of a configuration in which the semiconductor device according to the embodiments is used as a power-on reset circuit.

FIG. 15 is a diagram showing an example of a configuration of a semiconductor chip in which the semiconductor device 10 according to the embodiments is used as a power-on reset circuit. It is possible to integrate the semiconductor device 10 according to the embodiments with a logic circuit 20 as shown in FIG. 15 and embed them in a semiconductor chip. Here, the logic circuit 20 operates by using the power supply voltage VDD from the power supply node 101 and the ground GND from the ground node 102 as an operation power supply. A reset state and a reset release state of the logic circuit 20 are controlled by the reset signal RESETB outputted from the semiconductor device 10.

Figure 16:
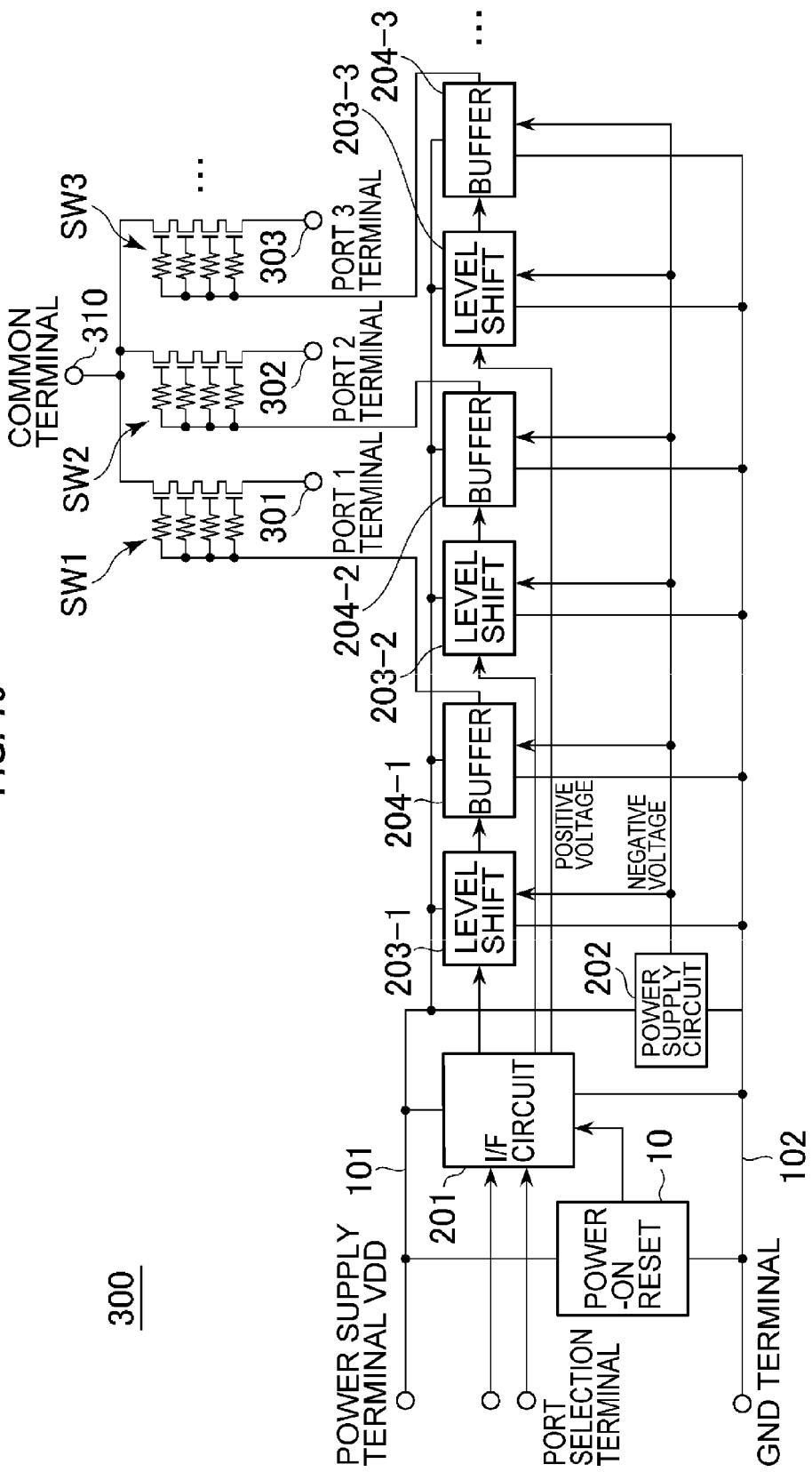
FIG. 16 is a diagram showing an example of a configuration of an RF switch circuit in which the semiconductor device according to the embodiments is used as a power-on reset circuit.

Hereinafter, a specific example of the logic circuit 20 will be described with reference to FIGS. 16 and 17. For example, the logic circuit 20 is illustrated by an interface (I/F) circuit 201 shown in FIG. 16. FIG. 16 is a diagram showing an example of a configuration of an RF switch circuit 300 in which the semiconductor device 10 according to the embodiments is used as a power-on reset circuit. As shown in FIG. 16, the RF switch circuit 300 according to the embodiments includes the semiconductor device 10 (power-on reset circuit 10), the I/F circuit 201, a power supply circuit 202, a plurality of level shift circuits 203-1, 203-2, 203-3, and so on, a plurality of buffers 204-1, 204-2, 204-3, and so on, and a plurality of switch circuits SW1, SW2, SW3, and so on (for example: FETs (Field effect transistors)).

The I/F circuit 201 operates by using the power supply voltage VDD supplied from the outside, decodes a port selection signal that controls switching of the switches, and outputs the decoded port selection signal to the input stage level shift circuits 203-1, 203-2, 203-3, and so on. The power supply circuit 202 generates a negative voltage using the power supply voltage VDD and supplies the negative voltage to the level shift circuits 203-1, 203-2, 203-3, and so on and the buffers 204-1, 204-2, 204-3; and so on. The level shift circuits 203-1, 203-2, 203-3, and so on operate by using the power supply voltage VDD supplied from the outside and selects either one of the positive voltage (ground voltage GND) and the negative voltage according to a logical value of the decoded signal inputted from the I/F circuit 201. The selected voltage is inputted into control terminals (for example, gates of FETs) of the switch circuits SW1, SW2, SW3, and so on from the level shift circuits 203-1, 203-2, 203-3, and so on through the corresponding buffers 204-1, 204-2, 204-3, and so on. The switch circuits SW1, SW2, SW3, and so on control coupling between a common terminal 310 and a port 301 (port 1), a port 302 (port 2), a port 303 (port 3), and so on, which correspond to the switch circuits SW1, SW2, SW3, and so on respectively, according to the voltage inputted into the control terminal.

The respective components shown in FIG. 16 may be integrated into one semiconductor chip or may be provided over different chips. The buffers 204-1, 204-2, 204-3, and so on may be omitted. In this case, the level shift circuits 203-1, 203-2, 203-3, and so on may directly drive the switch circuits SW1, SW2, SW3, and so on. A power supply circuit that generates a positive voltage different from the power supply voltage VDD supplied from the outside may be embedded in the RF switch circuit 300. In this case, the level shift circuits 203-1, 203-2, 203-3, and so on and the buffer circuits 204-1, 204-2, 204-3, and so on may operate by using the positive voltage generated by the power supply circuit. Further, when the switch circuits SW1, SW2, SW3, and so on are FETs, the RF switch circuit 300 may further include the same circuit block as that of the I/F circuit 201, the power supply circuit 202, the level shift circuits 203-1, 203-2, 203-3, and so on, the buffers 204-1, 204-2, 204-3, and so on, and the switch circuits SW1, SW2, SW3, and so on for switching power supply to back gates of the FETs. Further, the topology of the switch circuits SW1, SW2, SW3, and so on may be different, such as for example, a DP3T switch including two common terminals 310, a switch having a different number of ports, and a switch further including a branch where a nonselective port is grounded like RF.

Figure 17:
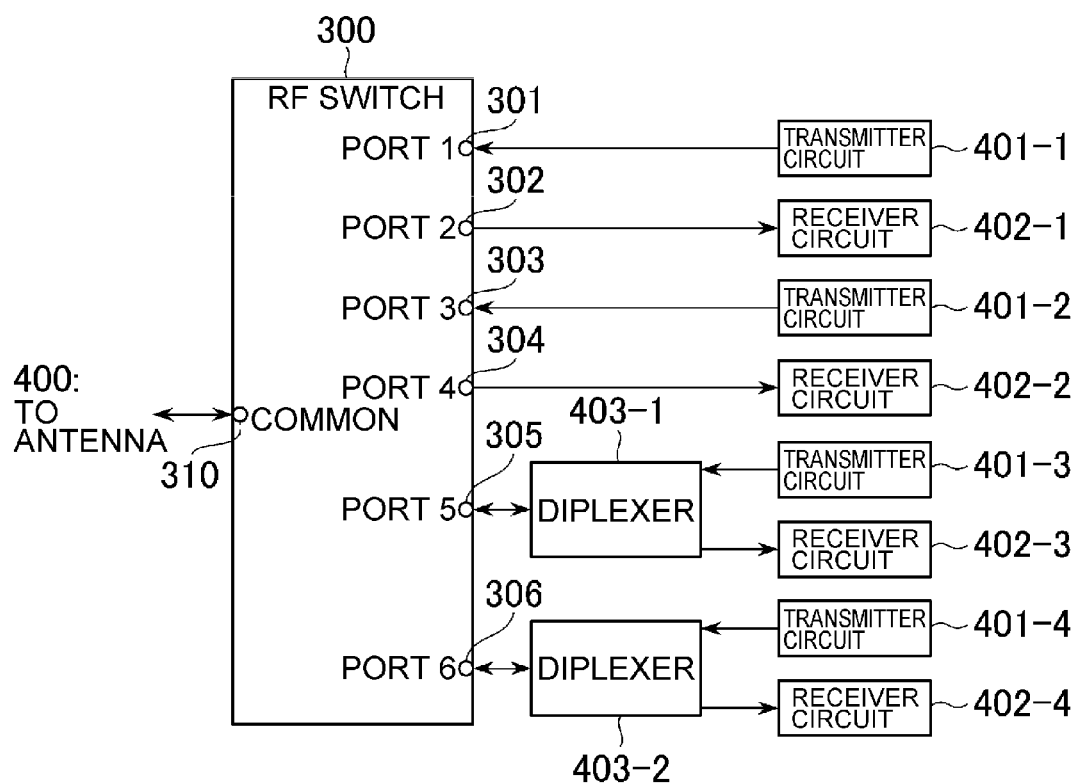
FIG. 17 is a diagram showing an example of a configuration of a wireless communication device in which the semiconductor device according to the embodiments is used as a power-on reset circuit.

The RF switch circuit 300 shown in FIG. 16 is preferably used in a wireless communication device shown in FIG. 17. FIG. 17 is a diagram showing an example of a configuration of a wireless communication device in which the semiconductor device 10 according to the embodiments is used as a power-on reset circuit. As shown in FIG. 17, the wireless communication device according to the embodiments includes the RF switch circuit 300, transmitter circuits 401-1 to 401-4, receiver circuits 402-1 to 402-4, and diplexers 403-1 and 403-2. The RF switch circuit 300 is coupled to an antenna 400 not shown through the common terminal 310. In the RF switch circuit 300, the transmitter circuit 401-1 and the receiver circuit 402-1 for a certain wireless communication method are coupled to the ports 301 and 302 (ports 1 and 2), the transmitter circuit 401-2 and the receiver circuit 402-2 for another wireless system are coupled to the ports 303 and 304 (ports 3 and 4), and a set of the transmitter circuit 401-3 and the receiver circuit 402-3 and a set of the transmitter circuit 401-4 and the receiver circuit 402-4 are coupled to the ports 305 and 306 (ports 5 and 6) through the diplexers 403-1 and 403-2. As an example, the ports 301 to 304 are ports for a TDD (Time Division Duplex) system and the ports 305 to 306 are ports for an FDD (Frequency Division Duplex) system.

The RF switch circuit 300 selects any one of the ports 301 to 306 and couples the selected port to one antenna terminal. The ports 301 and 302 and the ports 303 and 304 are used for frequency bands different from each other and systems of different communication systems. The port 305 and the port 306 are also used for frequency bands different from each other and systems of different communication systems.

In FIG. 17, signal lines for switching the ports and controlling ON/OFF of the transmitter circuits and the receiver circuits are omitted. In practice, there are separate blocks that control the ports and the circuits, and control lines are provided between the blocks and each component. The power supply node and the ground node are also omitted. However, in practice, these nodes are provided to each block.

The configuration shown in FIG. 17 is an example, and various combinations of the number of ports and the number of common terminals of the RF switch circuit 300 can be considered according to a difference of the number of systems to be handled and a difference of the number of antennas included in a terminal. The power-on reset circuit 10 according to the embodiments can be used without depending on the combination.

The RF switch circuit 300 shown in FIG. 17 may be one IC or may be formed by a module including a plurality of ICs or by a plurality of discrete elements and ICs.

The semiconductor device 10 (power-on reset circuit 10) according to the present embodiments is embedded to initialize the I/F circuit 201 when the power is turned on. The rise time of the power supply voltage in a communication device is very short, and for example, is 200 µsec to 400 µsec at most. On the other hand, a period of time from when the power supply voltage VDD becomes the desired voltage VC to when the reset state of the I/F circuit 201 is released is, for example, smaller than or equal to 100 nsec. Further, in a communication device, although the period of time from when the power supply voltage VDD becomes the desired voltage VC to when the reset state is released is defined by a standard, the minimum value of the rise time of the power supply voltage VDD is not defined. Therefore, the rise time of the power supply voltage VDD may be, for example, 1 µsec. The semiconductor device 10 according to the embodiments described above can release the reset state in an optimal period of time even if the rise time of the power supply voltage VDD is short, so that the semiconductor device 10 is preferably used as a power-on reset circuit of the RF switch circuit 300. In particular, the semiconductor device 10 according to the second embodiment can release the reset state even if the rise time of the power supply voltage VDD is short and further can release the reset state at any time after the time when the power supply voltage VDD becomes the desired voltage VC, so that the semiconductor device 10 can be preferably used in a system in which a period of time from when the power supply voltage VDD becomes the desired voltage VC to when the reset state is released is defined.

As described above, in the semiconductor device 10 according to the embodiments, it is possible to obtain a good output signal that satisfies the requirements of a power-on reset signal even when an applied power supply voltage has a steep rise.

While the embodiments of the present invention have been described in detail, the specific configuration is not limited to the embodiments described above, and it is possible to implement changes without departing from the scope of the present invention. For example, diodes are used as rectifying elements for generating detection voltages in the embodiments. However, it is not limited to this, and diode-coupled transistors may be used. The first embodiment, the second embodiment, and the modifications of the embodiments can be combined in a technically possible range.

What is claimed is:
1. A semiconductor device comprising:
  a first diode and a second diode that are connected in parallel in a forward direction between a first power supply and a second power supply;
  a first resistor circuit and a first capacitor element that are connected in parallel between the first diode and the first power supply;

a second resistor circuit and a second capacitor element that are connected in parallel between the second diode and the first power supply; and a comparator circuit that outputs a comparison result between a first voltage of a first node of the first resistor circuit and a second voltage of a second node of the second resistor circuit as a power-on reset signal, wherein the first resistor circuit includes a first resistor element having one end coupled to the first power supply and the other end coupled to the first diode through the first node, wherein the second resistor circuit includes a second resistor element and a third resistor element that are connected in series between the second diode and the first power supply through the second node, and wherein a product of a resistance value between the second node and the second diode and a size of the first diode is smaller than a product of a resistance value between the first node and the first diode and a size of the second diode.

2. The semiconductor device according to claim 1, wherein a capacitance ratio between the first capacitor element and the second capacitor element is substantially the same as a size ratio between the first diode and the second diode.

3. The semiconductor device according to claim 1, wherein the first resistor circuit further includes a fourth resistor element having one end coupled to the first node and the other end coupled to the first diode, and wherein a product of a resistance value of the third resistor element and a resistance value of the first resistor element is greater than a product of a resistance value of the fourth resistor element and a resistance value of the second resistor element.

4. The semiconductor device according to claim 1, wherein the second resistor circuit includes a fifth resistor element connected in series between the third resistor element and the second diode.

5. The semiconductor device according to claim 1, further comprising:

at least one third diode connected in series in the forward direction between the first resistor element and the first power supply; and at least one fourth diode connected in series in the forward direction between the second resistor element and the first power supply, wherein the number of the third diodes and the number of the fourth diodes are the same.

6. The semiconductor device according to claim 1, further comprising:

at least one fifth diode coupled to the first diode in series in the forward direction; and at least one sixth diode coupled to the second diode in series in the forward direction, wherein the number of the fifth diodes and the number of the sixth diodes are the same.

7. The semiconductor device according to claim 1, further comprising:

a CR delay circuit that delays an output signal of the comparator circuit.

8. The semiconductor device according to claim 1, further comprising:

a plurality of switch circuits that controls coupling between an antenna and a plurality of ports; and an I/F circuit which is coupled between the first power supply and the second power supply and which controls switching operations of the switch circuits on the basis of input data, wherein the power-on reset signal is supplied to the I/F circuit, and the I/F circuit is reset by the power-on reset signal of a first signal level and the reset of the I/F circuit is released by the power-on reset signal of a second signal level.

9. A wireless communication device comprising:
the semiconductor device according to claim 8; and
a plurality of transmitter circuits and a plurality of receiver circuits, which are coupled to the ports.

* * * * *